United States Patent
Cellier et al.

(10) Patent No.: US 10,216,867 B2
(45) Date of Patent: Feb. 26, 2019

(54) METHOD FOR MODELING A NON-AXISYMMETRIC SURFACE

(71) Applicant: SNECMA, Paris (FR)

(72) Inventors: Damien Joseph Cellier, Moissy-Cramayel (FR); Vincent Perrot, Moissy-Cramayel (FR); Matthieu Jean Luc Vollebregt, Moissy-Cramayel (FR); Nicolas Jean Fernand Pignier, Moissy-Cramayel (FR)

(73) Assignee: SAFRAN AIRCRAFT ENGINES, Paris (FR)

( * ) Notice: Subject to any disclaimer, the term of this patent is extended or adjusted under 35 U.S.C. 154(b) by 497 days.

(21) Appl. No.: 14/903,559

(22) PCT Filed: Jul. 7, 2014

(86) PCT No.: PCT/FR2014/051744
§ 371 (c)(1),
(2) Date: Jan. 7, 2016

(87) PCT Pub. No.: WO2015/004377
PCT Pub. Date: Jan. 15, 2015

(65) Prior Publication Data
US 2016/0154901 A1    Jun. 2, 2016

(30) Foreign Application Priority Data
Jul. 9, 2013 (FR) ...................... 13 56732

(51) Int. Cl.
G06F 17/50 (2006.01)
(52) U.S. Cl.
CPC .......... *G06F 17/50* (2013.01); *G06F 17/5009* (2013.01); *G06F 17/5086* (2013.01)

(58) Field of Classification Search
None
See application file for complete search history.

(56) References Cited

U.S. PATENT DOCUMENTS

2008/0232968 A1* 9/2008 Nguyen ................. F01D 5/143
                                                416/193 R

FOREIGN PATENT DOCUMENTS

WO  WO 2007/011355 A1   1/2007
WO  WO 2012/107677 A1   8/2012

OTHER PUBLICATIONS

Search Report and Written Opinion of the ISA in PCT/FR2014/051744 dated Sep. 23, 2014, with English translation coversheet. 13 pages.

(Continued)

*Primary Examiner* — Syed A Roni
(74) *Attorney, Agent, or Firm* — Womble Bond Dickinson (US) LLP

(57) ABSTRACT

A method for modeling at least part of a non-axisymmetric surface (5) of one portion (2) of a part (1). The portion (2) is bounded by first and second extremal planes (PS, PR). The method includes processing data from a device (10), by: (a) modeling at least two basic non-axisymmetric surfaces (Sk, SI, SE) making up the surface, each of the basic surfaces (Sk, SI, SE) extending between both extremal planes (PS, PR) of the portion (S); (b) constructing at least one connection curve (CR) tangential to the first and second surfaces; (c) locally modifying the first and second basic surfaces (Sk, SI, SE) to keep to the connection curve (CR) near a discontinuity; and (d) restoring, at least part of the obtained surface (5).

12 Claims, 10 Drawing Sheets

(56) References Cited

OTHER PUBLICATIONS

Search Report in French Application No. 1356732 dated Apr. 1, 2014, with English translation coversheet. 12 pages.
Burgos et al. "Rapid Meshing of Turbomachinery Rows Using Semi-Unstructured Multi-Block Conformal Grids." Engineering with Computers vol. 26, No. 4 (Dec. 15, 2009). pp. 351-362. 12 pages.
Bonaiuti et al. "Analysis and Optimization of Transonic Centrifugal Compressor Impellers Using the Design of Experiments Technique." Journal of Turbomachinery, vol. 128 No. 4 (Jan. 1, 2006). pp. 786-797. 12 pages.
Giannakoglou. "A Design Method for Turbine Blades Using Genetic Algorithms on Parallel Computers." Computational Fluid Dynamics (Jan. 1, 1998). pp. 1-6. 6 pages.

* cited by examiner

METHOD FOR MODELING A NON-AXISYMMETRIC SURFACE

GENERAL TECHNICAL FIELD

The present invention relates to the computer-aided design.

More precisely, it relates to a modeling process of a non axisymmetric surface of a piece such as a hub or a casing.

PRIOR ART

The necessity for constant improvement to equipment performance, in particular aeronautical, for example turbo-reactor rotors (that is, the assembly formed by a hub on which blades extending radially are fixed, as in FIG. 1a), today imposes the use of computer modeling tools.

These tools help design pieces by automatedly optimising some of their characteristics by the execution of many simulation calculations.

Research of a geometric aeromechanical and/or acoustic optimum on rotors now results in producing hubs having a locally non-axisymmetric wall (that is, a section according to a plane perpendicular to the axis of rotation is not circular) at the level of the vein, that is, all the ducts between the blades for fluid flow (in other words the interblade sections), in light of the particular conditions prevailing. The non-axisymmetric vein defines an overall annular surface of a three-dimensional space (a "tranche" of the hub).

In general, optimising a characteristic of a piece requires parameterising of a law (in other words one or more curves describing the value of a physical quantity according to a curve along the piece, in a given environment) to be optimised, that is, making a function of N entry parameters thereof. Optimisation consists of varying (in general randomly) these different parameters under constraint, to the point of determining their optimal values for a predetermined criterion. A "smoothed" curve is then obtained by interpolation from the determined points of passage.

The number of necessary calculations is linked directly (linearly or even exponentially) to the number of entry parameters of the problem.

Many methods of parameterisation of a law exist, and two major categories can be distinguished in particular:

Discrete model: the law is defined by the position of a plurality of points, shifted one by one during optimisation;

Parametric model: the law is defined via mathematical curves known in the literature, such as Bezier curves or NURBS curves (non-uniform rational B-splines).

Specific parameterisation methodologies have been developed in the precise case of non-axisymmetric veins. A family of methods can be distinguished, known as modification methods by points of attraction at the level of the wall, i.e. definition of hollows and bosses, which consists of an axisymmetrical surface, and revealing hollows and bosses.

Alternatively, methods called methods by modification by characterisation of "sections" have been proposed. Each section for passage of fluid is drawn between two blades, and the evolution of the wall according to these sections.

In other words laws are parameterised according to a plurality of fluid flow paths between the blades (repeating the methodology general explained hereinabove), so as to define a plurality of elementary surfaces corresponding to the vein over the entire periphery of the wall.

Even though more interesting from the aerodynamic viewpoint, methods by characterisation of section are far more complex and rarely used.

In fact, as is evident in FIG. 1c which will be described later, one of the resulting difficulties relates to the continuity between the elementary surfaces, in particular upstream and downstream of the blade. In fact, the section cannot be the same at the intrados and at the extrados of the blade, which involves a problematic "stair" upstream and downstream of the blading.

Today there is no method by characterisation of sections which conserves aeromechanically sound geometry (i.e. without any singularity).

It would be preferable to find a new way to model a non-axisymmetric surface in its entirety, responding to the demands of continuity of the wall, respect for manufacturing constraints, all this leaving the user with a substantial margin to manoeuvre in the design.

PRESENTATION OF THE INVENTION

The present invention proposes according to a first aspect a modeling process of at least part of an non-axisymmetric surface of a portion of a piece, the portion being limited by a first and a second extremal plane, the process being characterized in that it comprises performing by data-processing means of equipment, steps of:

(a) Modeling at least two non-axisymmetric elementary surfaces making up said surface, each of the elementary surfaces extending between the two extremal planes of the portion and being defined by at least one construction curve extending according to a plane substantially parallel to the extremal planes, a first and a second elementary surface being juxtaposed so as to present a junction at least $C^1$ at the level of the extremal planes and at least one discontinuity;

(b) Construction of at least one connecting curve of class $C^1$ defined by a first and a second extremal point respectively arranged on the first and the second elementary surface, said connecting curve being tangential to the first and the second surface respectively at the first and the second extremal point;

(c) Local modification of the first and second elementary surfaces so as to respect said connecting curve in the vicinity of said discontinuity;

(d) Output on an interface of said equipment of the at least one part of the resulting surface.

The present process corresponds to a method by characterisation of sections in which the aim is not to avoid discontinuities, but very much the contrary. The latter are obtained, then corrected a posteriori without modifying the geometry of the non-axisymmetric surface to retain all the advantages of these methods (aerodynamic qualities and substantial margin to manoeuvre), without the disadvantages (singularities).

Also, the process is particularly optimised to best improve the quality of the models and lower the required calculation power.

According to other advantageous and non-limiting characteristics:

a plurality of blades is arranged on the circumference of the portion of a piece, each elementary surface extending between two blades such that the first and second elementary surfaces are arranged on either side of a blade, respectively on the intrados and the extrados;

the junction between the first and second elementary surfaces has a first discontinuity extending from the first extremal plane to the leading edge of the blade and a second discontinuity extending from the trailing edge of the blade to the second extremal plane;

a connecting curve is constructed at step (b) for each of the first and second discontinuities, each connecting curve being tangential to the blade at the level of the trailing edge or of the leading edge;

a connecting curve passes via a midpoint arranged on the trailing edge or of the leading edge of the blade such that the distance between the midpoint and the first elementary surface is equal to the distance between the midpoint and the second elementary surface;

a connecting curve is a spline entirely defined by the extremal points and the midpoint;

step (c) comprises for each of the first and second discontinuity the construction of a connecting surface having at any point of its edge a continuity of tangency with the first or the second elementary surface;

each elementary surface has at least one construction curve arranged between the leading edge and the trailing edge of the blade, each of the two connecting surfaces extending over each of the first and second elementary surfaces of an extremal edge as far as the first construction curve beyond the connecting curve;

step (a) comprises for each construction curve of each elementary surface sub-steps of:

(a1) Parameterisation of the construction curve as curve of class $C^1$ representing the value of a physical quantity characteristic of said surface as a function of a position along a width of the elementary surface, the curve being defined by:

Two extremal control points, respectively on each of the two blades between which said elementary surface extends, defining the extent of said width of the elementary surface;

At least one spline;

the parameterisation being carried out according to one or more parameters defining at least one of the extremal control points;

(a2) Determination of optimised values of said parameters of said curve.

each construction curve of each elementary surface is likewise defined by at least one intermediate control point arranged between the extremal points and at least two splines connected at the level of said intermediate control point; the parameterisation being likewise conducted according to one or more parameters defining said intermediate control point;

the parameter(s) defining an intermediate or extremal control point defining a construction curve are selected from an abscissa of the point, an ordinate of the point, an orientation tangential to the curve at the level of the point and at least one tension coefficient linked to a half-tangent to the curve at the level of the point;

a tension coefficient linked to a half-tangential to the curve at the level of an intermediate or extremal point is a function of a second derivative value of the curve in the vicinity of the point;

each spline of a construction curve is a Bezier curve determined entirely by the control points defining its ends.

According to a second then a third aspect, the invention relates to a manufacturing process of a piece whereof a portion has a non-axisymmetric surface, the process comprising steps of:

Performing the process according to the first aspect so as to model at least one part of said non-axisymmetric surface of the portion of the piece;

Manufacture of said piece in accordance with the modeling of the at least one part of the resulting surface;

As well as a piece whereof a portion has a non-axisymmetric resulting surface via the process according to the second aspect.

According to a fourth aspect, the invention relates to modeling equipment of at least one part of a non-axisymmetric surface of a portion of a piece, the portion being limited by a first and a second extremal plane, the equipment being characterized in that it comprises data-processing means configured to implement:

A modeling module of at least two non-axisymmetric elementary surfaces making up said surface, each of the elementary surfaces extending between the two extremal planes of the portion and being defined by at least one construction curve extending according to a plane substantially parallel to the extremal planes, a first and a second elementary surface being juxtaposed so as to present a junction at least $C^1$ at the level of the extremal planes and at least one discontinuity;

A construction module of at least one connecting curve of class $C^1$ defined by a first and a second extremal point respectively arranged on the first and the second elementary surface, said connecting curve being tangential to the first and the second surface respectively at the first and the second extremal point;

A local modification module of the first and second elementary surfaces so as to respect said connecting curve in the vicinity of said discontinuity;

An output module on an interface of said equipment of the at least one part of the resulting surface.

According to a fifth and sixth aspect, the invention relates respectively to a computer program product comprising code instructions for executing a process according to the first aspect of the invention for modeling of at least one part of a non-axisymmetric surface of a portion of a piece; and storage means readable by computer equipment on which a computer program product comprises code instructions for executing a process according to the first aspect of the invention for modeling of at least one part of a non-axisymmetric surface of a portion of a piece.

PRESENTATION OF FIGURES

Other characteristics and advantages of the present invention will emerge from the following description of a preferred embodiment. This description will be given in reference to the appended drawings, in which:

FIG. 1a previously described illustrates an example of a reactor on walls of which the process according to the invention is implemented;

DETAILED DESCRIPTION

The aim of the present process is modeling of at least one part of a non-axisymmetric surface of a portion of a piece.

This piece can be a hub or a casing, and in general any piece of a reactor having an inner/outer wall against which air circulates. In reference to FIG. 1a previously introduced (which illustrates a CFM-56 reactor), the following areas can be mentioned (which have been enclosed for easy location):

Fan

OGV ("Outlet Guide Vane", i.e. rectifying bladings of the secondary flow)+secondary arm Booster+primary arm High-Pressure Compressor High-Pressure Turbine Low-Pressure Turbine.

Throughout the present description the example of modeling of the hub at the level of the High-Pressure Compressor area (third area enclosed from the left or the right) will be used, but those skilled in the art can transpose to any other piece of the reactor.

Figure 1A:
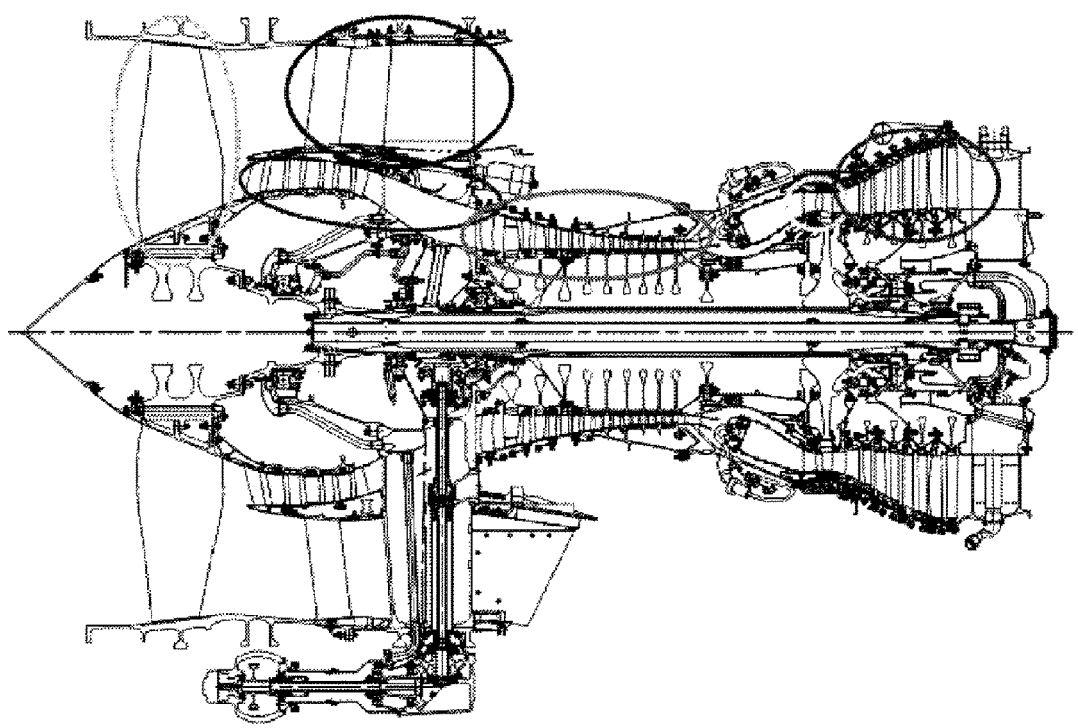
FIGS. 1b-1c illustrate a detail of a non-axisymmetric vein.
Figure 1B:
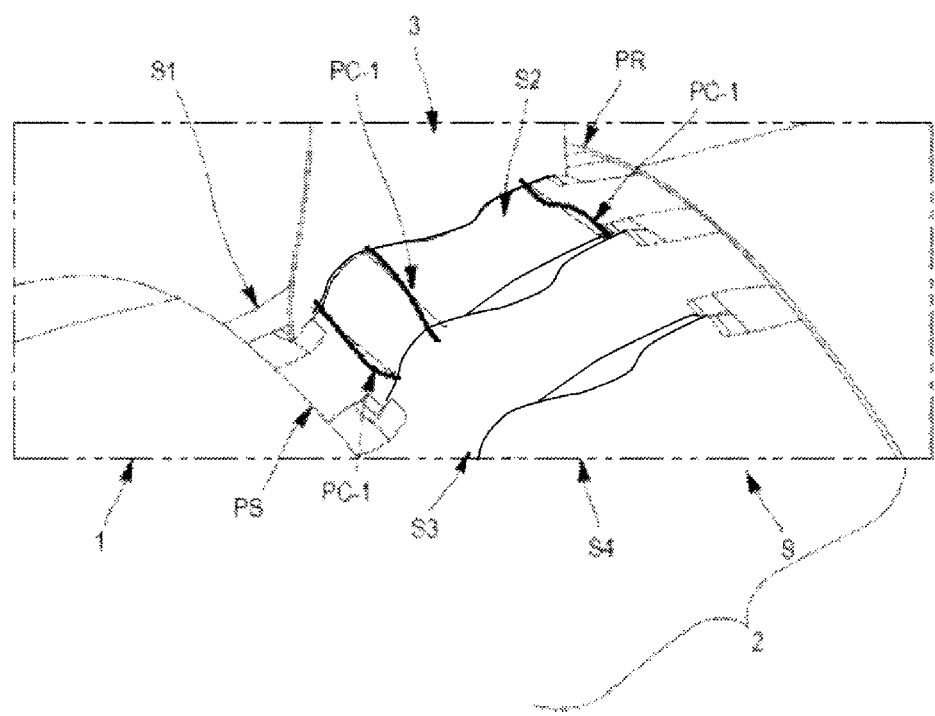
Figure 1C:
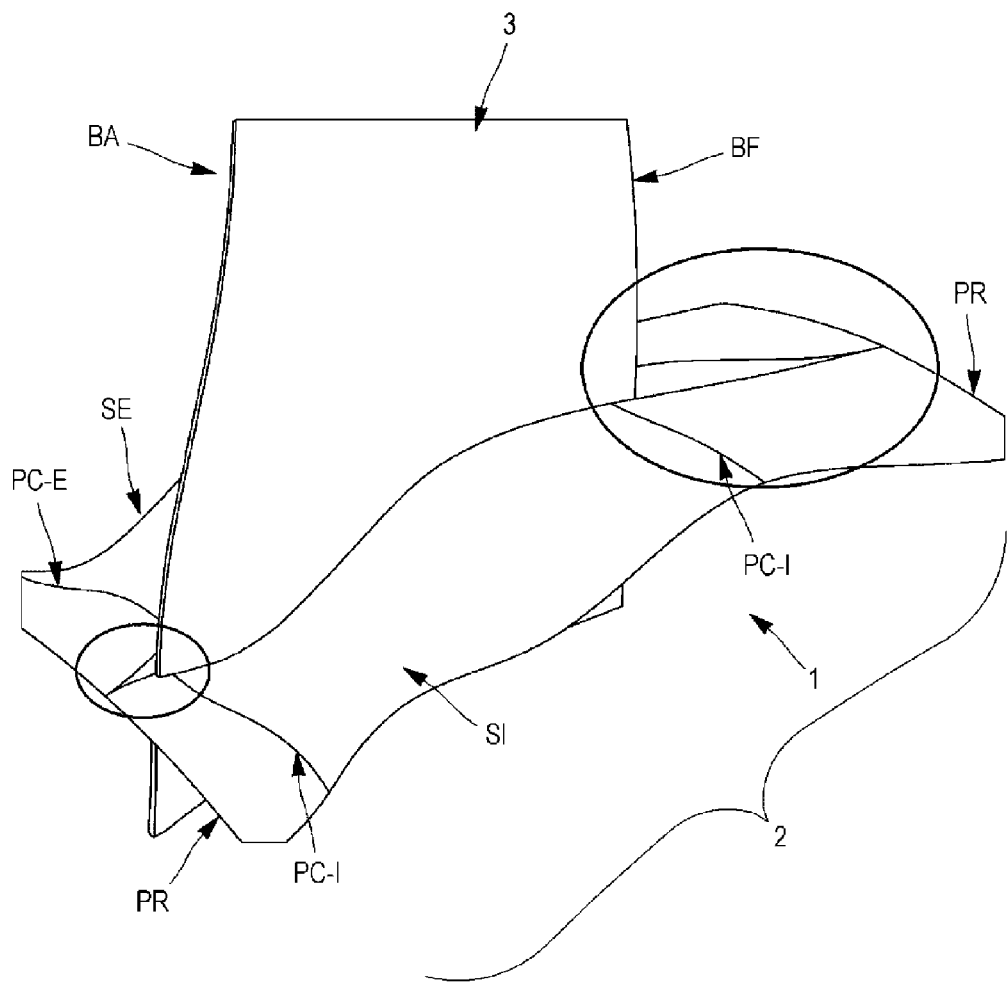

FIG. 1b shows this hub 1 and in particular a non-axisymmetric portion 2, limited upstream by a first extremal plane, the "Plane of separation" PS and downstream by a second extremal plane, the "Plane of connection" PR. It should be noted that the hub can have a plurality of portions 2 (for example in the case of several rows of blades), optionally separated by axisymmetrical areas.

The portion 2 has a surface S defining a substantially toroidal form, whereof at least one part is modeled by the present process.

As explained, the latter takes up the methods known as modification methods by characterisation of "sections". This process proposes an innovative solution to the problems of continuity: instead of trying at all cost to avoid discontinuities between two sections, the process will by comparison do nothing to prevent their appearance, then will eliminate them a posteriori by using connecting curves, which will be described later.

The part of the modeled surface S comprises at least two elementary surfaces (in FIG. 1a there are four elementary surfaces referenced Sk, $k \in [\![1;4]\!]$), elementary surfaces which are modeled independently via the construction of at least one construction curve, likewise called "construction plane", during a first step (a) which will be described later (in FIG. 1a three construction curves PC-k define the first of the elementary surfaces Sk).

Each of these elementary surfaces has a substantially rectangular form and extends between the two extremal planes PS, PR of the portion 2. The surface S is reconstituted in the form of a plurality of juxtaposed bands.

Two adjacent elementary surfaces $S_k$ and $S_{k+1}$ present a particular frontier. As is always evident in the figures, a first and a second adjacent elementary surface are juxtaposed so as to present a junction at least $C^1$ at the level of the extremal planes PS, PR. In other words, the intersection between the hub 1 and each of the planes PR and PS defines a continuous curve and continuous derivative (this curve is closed and forms a loop), a curve respected by the elementary surfaces at the level of their ends, resulting in the continuity of value and derivative at the level of the points of juxtaposition.

Between their two ends, the edge "common" to two juxtaposed elementary surfaces has at least one discontinuity, that is, a point such that the elementary surfaces are disjointed.

More formally, defining a cylindrical reference centred on the axis of the hub 1 (any point of the surface of the hub is defined by a triplet $(r, \theta, z)$, with r the radius, that is, the distance between the point of the wall and the axis of the hub, ($\theta$ the angle on the circumference of the hub, and z the position according to the axis of the hub), then:

The portion 2 can be defined by $\{(r, \theta, z), z \in [z_S, z_R]\}$;

PS and PR can be respectively defined by $\{(r, \theta, z), r=r_S, z=z_S\}$ and $\{(r, \theta, z), r=r_R, z=z_R\}$;

An elementary surface $S_k$ can be defined by an equation $\{(r_k(\theta, z), \theta, z) z \in [z_S, z_R], \theta \in [\theta_k, \theta_{k+1}], r_k(\theta, z_S)=r_S, r_k(\theta, z_R)=z_R\}$, such as $\exists z \in ]z_S, z_R[, r_k(\theta_k, z) \neq r_{k+1}(\theta_k, z)$, which defines the point of discontinuity.

Generally, this discontinuity is verified over the entire open interval $]z_S, z_R[$ (in other words, the sole continuity is seen on PR and PS).

As is seen in particular in FIG. 1b, the wall of the hub 1 is traversed by blades (in other words vanes). These blades 3, arranged uniformly or not (in this second case, the basis is scaling) on the circumference of the wall 2, extending radially.

Preferably, there is alternating of blades and elementary surfaces. In other words, each elementary surface extends between two blades, and in yet other terms, an elementary surface is arranged to each side of a blade.

One of these sides is the extrados of the blade, and the other is the intrados. In this way, for a given blade 3 (such as that shown by FIG. 1b), an elementary intrados surface SI and an elementary extrados surface SE can be defined, which are two juxtaposed elementary surfaces. The curves of constructions PC-I and PC-E of each of these two elementary surfaces SI, SE are also marked. Similarly, a given elementary surface is at the same time the elementary intrados surface SI of a blade bordering it, and the elementary extrados surface SE of the other blade bordering it.

It is also clear that it is possible to model any elementary surface Sk as the union of two "half-surfaces" each extending over half the width of the vein. The "right" half-surface therefore plays the role of extrados surface of a blade bordering it, and the "left" half-surface plays the role of intrados surface of the other adjoining blade. This is however only a convention of representation among others and changes nothing in the execution of the process.

In the rest of the present description, the simple case of a blade 3 enclosed by two juxtaposed elementary surfaces will be used: the first is the elementary extrados surface SE of the blade, and the second is the elementary intrados surface SI of the blade.

The blade 3 occupies the major part of the junction, but leaves a first "leading" discontinuity extending from the first extremal plane PS to the leading edge BA of the blade 3 and a second discontinuity extending from the trailing edge BF of the blade 3 to the second extremal plane PR.

The present process enables construction of a connecting surface SR for each of the first and second discontinuities (SR surfaces which will be shown in figures to be described later).

Figure 2:
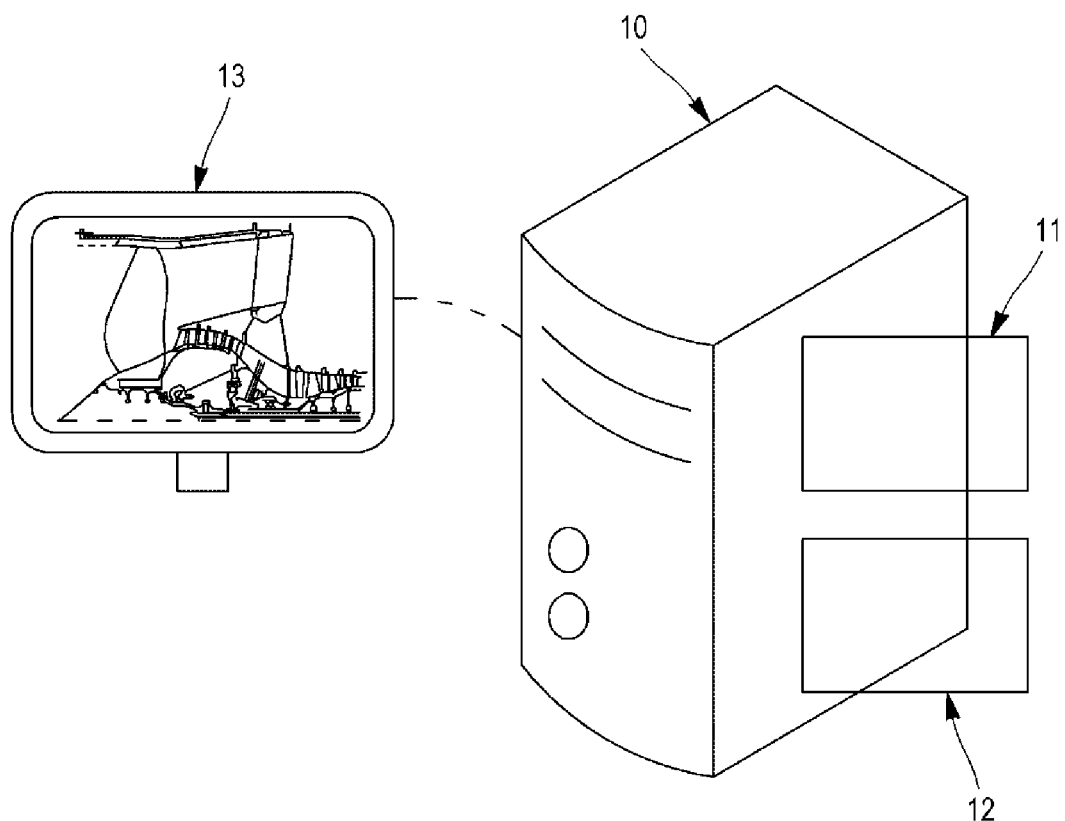
FIG. 2 illustrates a system for performing the process according to the invention.

In general, the part of the surface S is modeled in the present process, during its design, via computer equipment 10 of the type of that shown in FIG. 2. It comprises data-processing means 11 (one or more processors), data storage means 12 (for example one or more hard drives), interface means 13 (comprising input means such as a keypad and mouse or tactile interface, and output means such as display monitor for results). By way of advantage the equipment 10 is a supercomputer, but it is understood that execution on various platforms is quite possible.

Modeling Elementary Surfaces

The first part (a) of the present process sees the modeling of elementary surfaces Sk, SI, SE independently of each other. It should be noted that in the advantageous (but non-limiting) case of periodicity in the circumference of the hub (that is, if the blades 3 are identical and distributed uniformly), all the elementary surfaces will be identical and it suffices to model one then duplicate it.

The principle here is to determine a geometric and/or acoustic aeromechanical optimum, of laws of an elementary surface, in other words of one or more curves describing the value of a physical quantity (in particular the radius, that is, the distance from a point of the elementary surface to the centre of the hub) along a width of the elementary surface (as explained earlier an elementary surface $S_k$ is defined by its construction curves PC-$_k$, each extends according to a plane substantially parallel to the extremal planes PS, PR of the portion 2) in a given environment, by the execution of many simulation calculations.

Many criteria can be selected as criteria for optimising during modeling of an elementary surface. By way of example, attempts can be made to maximise mechanical properties such as resistance to mechanical stresses, frequential responses, displacements of blades 3, aerodynamic properties such as yield, pressure elevation, rate capacity or pumping margin, etc.

For this it is necessary to parameterise the law to be optimised, that is, make of it a function of N entry parameters. Optimisation consists of varying (in general randomly) these different parameters under stress to determine their optimal values for a predetermined criterion. A "smoothed" curve is then obtained by interpolation from determined points of passage.

The necessary number of calculations is directly linked (linearly or exponentially) to the number of entry parameters of the problem.

Many methods are known, but a method similar to that described in patent application FR1353439 will preferably be employed, which enables excellent modeling quality without high calculating power consumption, and limits the Runge phenomenon (excessive "undulation" of the surface).

More generally, the process advantageously comprises for each construction curve PC-k, PC-I, PC-E of each elementary surface Sk, SI, SE performing sub-steps of:

(a1) parameterisation of the construction curve PC as curve of class $C^1$ representing the value of a physical quantity characteristic of said surface S (typically the radius) as a function of a position along at least a width of the elementary surface Sk, SI, SE, the curve being defined by:
  Two extremal points $PCU_I$, $PCU_E$ (for "User Control Point") respectively on the intrados and the extrados of said width of the elementary surface Sk, SI, SE;
  At least one spline;
  parameterisation being executed according to one or more parameters defining at least one of the extremal control points $PCU_I$, $PCU_E$;
(a2) Determination of optimised values of said parameters of said curve.

The first sub-step (a1) is performed by the data-processing means 11 under control of one operator.

The position along the width of the elementary surface Sk, SI, SE is expressed as a function of the length of cord (in abscissa), and more precisely the "standardised" length of cord, that is, expressed between 0 and 1 when the elementary surface Sk, SI, SE is traversed, in other words when moving from one blade 3 to another. It should be noted that as explained, the elementary surface Sk, SI, SE is located at the level of the intrados of one of these two blades 3, and of the extrados of the other, which is why the path corresponds to an intrados-extrados passage.

It is clear however that the invention is not at all limited to the expression of a curve representing the value of a quantity as a function of width and other markers are possible.

This curve representing the value of a physical quantity must be understood as modeling of a law of this physical quantity (in this way it will be designated under the name of "modeling curve" to distinguish it from Bezier curves in terms of terminology). Said physical quantity can be any quantity having an aeromechanical and/or acoustic meaning for the design of elementary surfaces Sk, SI, SE, but this is typically the radius mentioned earlier.

The modeling curve is of a class of regularity at least $C^1$, that is, it corresponds to a continuous function and at least $1^{st}$ continuous derivative on its definition space (the width of the elementary surface). The importance of this condition will be seen later. In practice, the curve obtained is $C^\infty$ by pieces (functions indefinitely derivable at each interval), with continuity of the curve and the derivative at the level of any connections (the intermediate control points which will be defined). It is clear that these are minimal conditions and that the curve can utterly be for example $C^\infty$ over its entire space of definition.

Figure 3A:
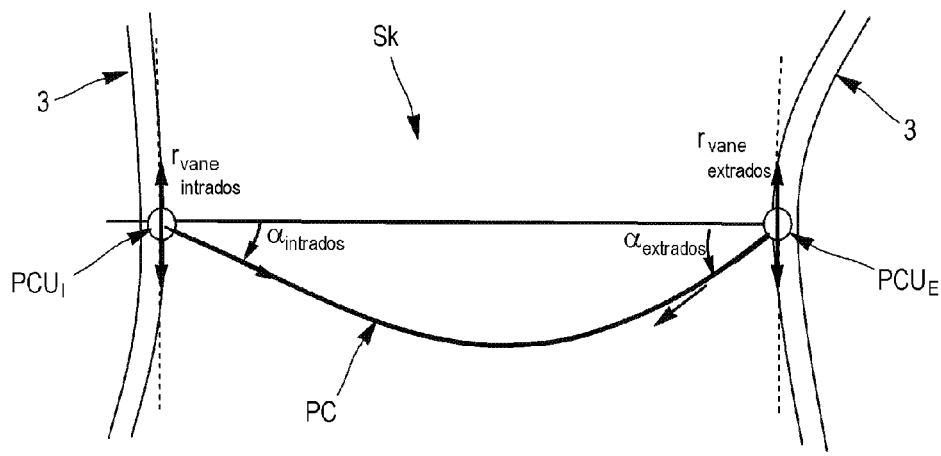
FIGS. 3a-3b illustrate two examples of construction curves of an elementary surface used by the process according to the invention.

The curve is defined by its control points. As is clear in FIG. 3a, which illustrates a first modeling example, two user extremal control points $PCU_I$ and $PCU_E$ (respectively the "Intrados" and "Extrados" control points according to the side of the blade 3 at the level where they are) are fixed and define the extent of the elementary surface (i.e. the field of definition of the curve).

The modeling curve comprises at least one spline which connects these extremal points. The splines are polynomial parametric curves, examples of which preferably are Bezier curves defined as combinations of N+1 elementary polynoms known as Bernstein Polynoms: a Bezier curve is defined by all the points $\Sigma_{i=0}^{N} B_i^N(t) \cdot P_i$, $t \in [0,1]$, the $B_i^N(t) = \binom{N}{i} t^i (1-t)^{N-i}$ being the N+1 Bernstein polynoms of degree N.

The points $\{P_0, P_1 \ldots P_N\}$ are called "implicit" control points of the curve and constitute the variables by which a law of an elementary surface can be modeled by a Bezier curve.

These points are called "implicit" as a Bezier curve can be seen as all the barycentres of N+1 control points weighted by a weight equal to the value of the Bernstein polynom linked to each control point. In other words, these points act as localised weights attracting the curve generally without it passing through (outside the first and the last, corresponding respectively to t=0 and t=1, and some cases of alignment of points).

In general, in known modeling techniques of a law using a Bezier curve, the extremal control points $P_0$ and $P_N$ of the used curve are fixed (they define the extent over which the modeling will be performed), but the other points $\{P_1 \ldots P_{N-1}\}$ have mobile coordinates constituting the entry parameters for the optimisation algorithm.

In the present process, one (or even more) intermediate user control point $PCU_M$ (for "Middle") is advantageously arranged between these two extremal points $PCU_I$ and $PCU_E$.

Figure 3B:
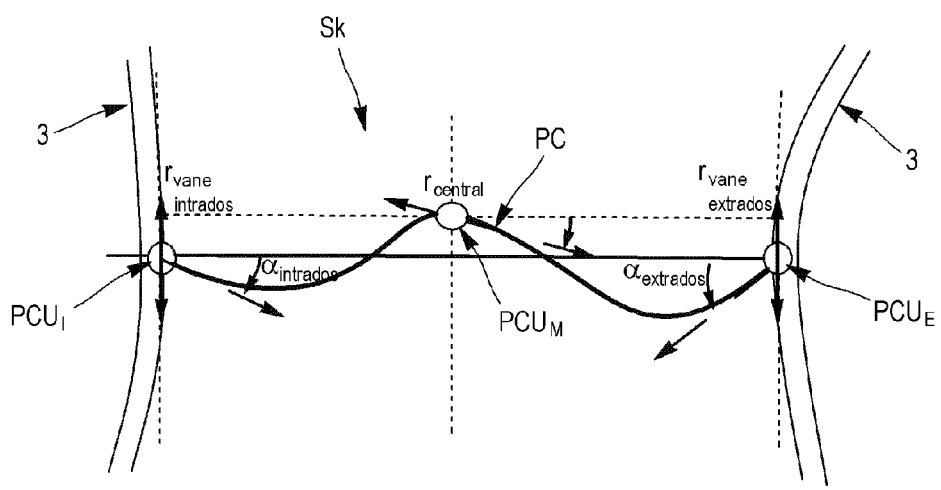

This case is shown by FIG. 3b. The intermediate point(s) are "explicit" and non-implicit control points, as the curve passes through. In fact, the latter comprises at least two splines connected at the level of said intermediate point.

In an embodiment, the modeling curve can consist of only one sequence of Bezier curves, each extending between an extremal control point $PCU_I$, $PCU_E$ and an intermediate point $PCU_M$, or between two intermediate points $PCU_M$.

In other words, all the user control points $PCU_I$, $PCU_N$, $PCU_E$ (extremal or intermediate) of the curve are extremal control points $P_0$, $P_N$ of a Bezier curve.

The fact that the curve is of class $C^1$ implies that each intermediate point $PCU_M$ ensures continuity including on the derivative (same tangent).

The processing parameterises the modeling curve as a function of parameters of extremal control points (and optionally intermediate) defining ends of splines constituting the modeling curve of a construction plane PC-k, PC-I, PC-E.

In particular, if these splines are Bezier curves, each can be entirely determined by the points PCU defining its ends. In other words, the parameters of points PCU (in terms of coordinates and derivatives) serve as conditions to the limits for calculation by the data-processing means 11 of the coordinates of implicit control points of the different Bezier curves which are selected from the minimal degree needed to satisfy these limit conditions. Step (a1) comprises the definition of implicit points of the Bezier curves as a function of the parameters of the points PCU constituting their ends.

The parameter(s) defining a control point PCU are selected from an abscissa of the point, an ordinate of the point, orientation of tangent to the curve at the level of the point and one (in the case of an extremal control point $PCU_I$, $PCU_E$: only the half-tangent in the field of definition of the curve can be taken into account, the one to the left for $PCU_E$ and the one to the right for $PCU_I$) or two (in the case of an intermediate control point $PCU_M$) tension coefficients each linked to a half-tangent to the curve at the level of the point.

Knowing that the curve is of class $C^1$ (continuous derivative), the orientation of the tangent must be the same on either side of an intermediate point $PCU_M$. Yet, the "length" of the two half-tangents can be different on either side of the point, a length which expresses the propensity of each Bezier curve on either side of the point to "stick" to the tangent. This is what the "tension coefficients" mentioned previously model.

Specifically, each tension coefficient linked to a half-tangent to the curve at the level of an intermediate point is a function of a second derivative value of the curve in the vicinity of the point. In fact, the value of the second derivative in the vicinity of the control point expresses the "speed" with which the curve moves away from the tangent.

And the fact that the modeling curve is not necessarily of class $C^2$ authorises discontinuities of second derivative at the level of the intermediate points.

It should be noted that all the parameters mentioned previously are necessarily used effectively. In fact, in the majority of cases, one or more of these parameters (an abscissa of the point, an ordinate of the point, orientation of tangent to the curve at the level of the point and two tension coefficients each linked to a half-tangent to the curve at the level of the point) have a predetermined value fixed by the user and are therefore not used as "variables" for the rest of the process.

According to a second sub-step (a2), the process comprises a determination step by the data-processing means 11 of optimised values (and if possible optimal) of said parameters of said curve. This is an optimisation step.

Many techniques for performing this step are known to those skilled in the art, and the variable selected parameters could for example simply be varied pseudo-randomly while effecting simulations to determine these optimised values (that is, for which the selected criterion is maximised) of the parameters of the control points PCU. The invention is not however limited to this possibility.

Once the values of the parameters are determined, the processing means 11 obtain the equation of the constructions curves PC-k, PC-I, PC-E, and reconstruct the entire elementary surface Sk, SI, SE (using the equations of the extremal planes PS, PR).

The step is optionally repeated to model diverse elementary surfaces Sk, SE, SI (alternatively, it is possible to consider that all the elementary surfaces are identical and simply transpose the resulting modeling).

Connecting Curve

Figure 4A:
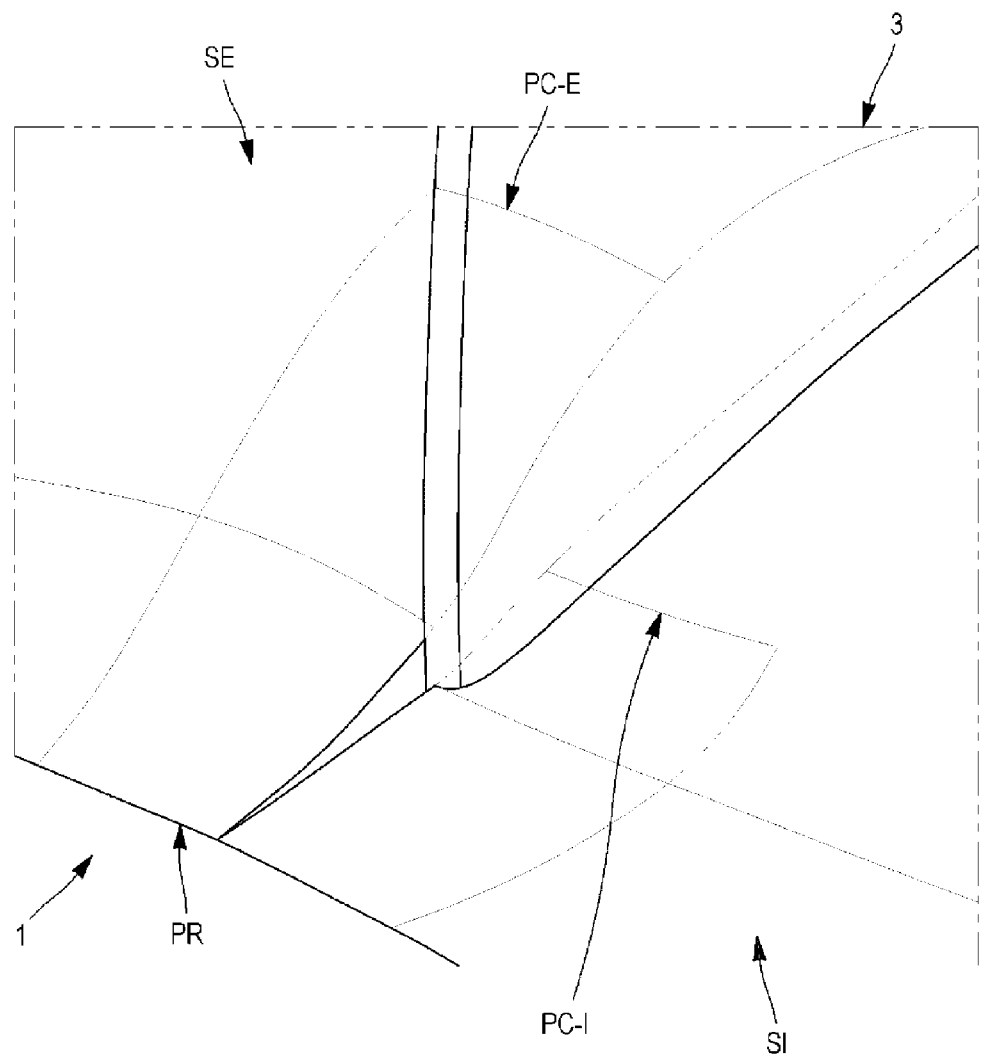
FIG. 4a-4d illustrate the construction of a connecting surface at the level of a leading edge.

Once the first elementary surface SE and second elementary surface SI are modeled (step (a)), the state shown by FIG. 4a is the result. The presence of the first "leading" discontinuity is noted. In the rest of the present description, only the example of the processing of this first discontinuity will be seen, but it will be clear that those skilled in the art could perform the same steps at the level of the second "trailing" discontinuity.

It should be noted that the leading BA and trailing BF edges are here "real" edges (that is, the points which are really the foremost and rearmost of the blade 3), sometimes different to theoretical edges (which follow the skeleton of the blade). For example, the curvature of the blade 3 generally ensures the leading edge BA is offset to the intrados.

The real edges BA, BF appear naturally by construction when the present process is performed. For example, as per FIG. 4a for each of the elementary surfaces SE, SI a point of intersection with the front of the blade 3 at the level of the end of the discontinuity is noted. These two points define the leading edge reel BA, embodied in FIG. 4b. The curves of the relevant elementary surfaces SE, SI are referenced PC-BA in this figure.

The "real" edge BA corresponds in fact to a reflection line, that is, a curve whereof the normal to the surface (of the blade 3) at each point has the same angle relative to a determined direction, in this case that of the junction between the two elementary surfaces SE, SI.

This consideration of the real edges BA, BF enables automatic correction of errors due to extrapolation of the skeleton from the blade 3, and aids performing the following step of the present process.

In this step (b), at least one connecting curve CR of class $C^1$ is constructed defined by a first and a second extremal point $PCR_I$, $PCR_E$ ("connecting control point") respectively arranged on the first and the second elementary surface Sk, SI, SE.

Typically, each extremal point is on a centerline of the elementary surface SE, SI, the two points passing through a plane parallel to the planes PR, PS so that the connecting curve is tangential to the blade 3 at the level of the leading edge BA (respectively the trailing edge BF).

Figure 4B:
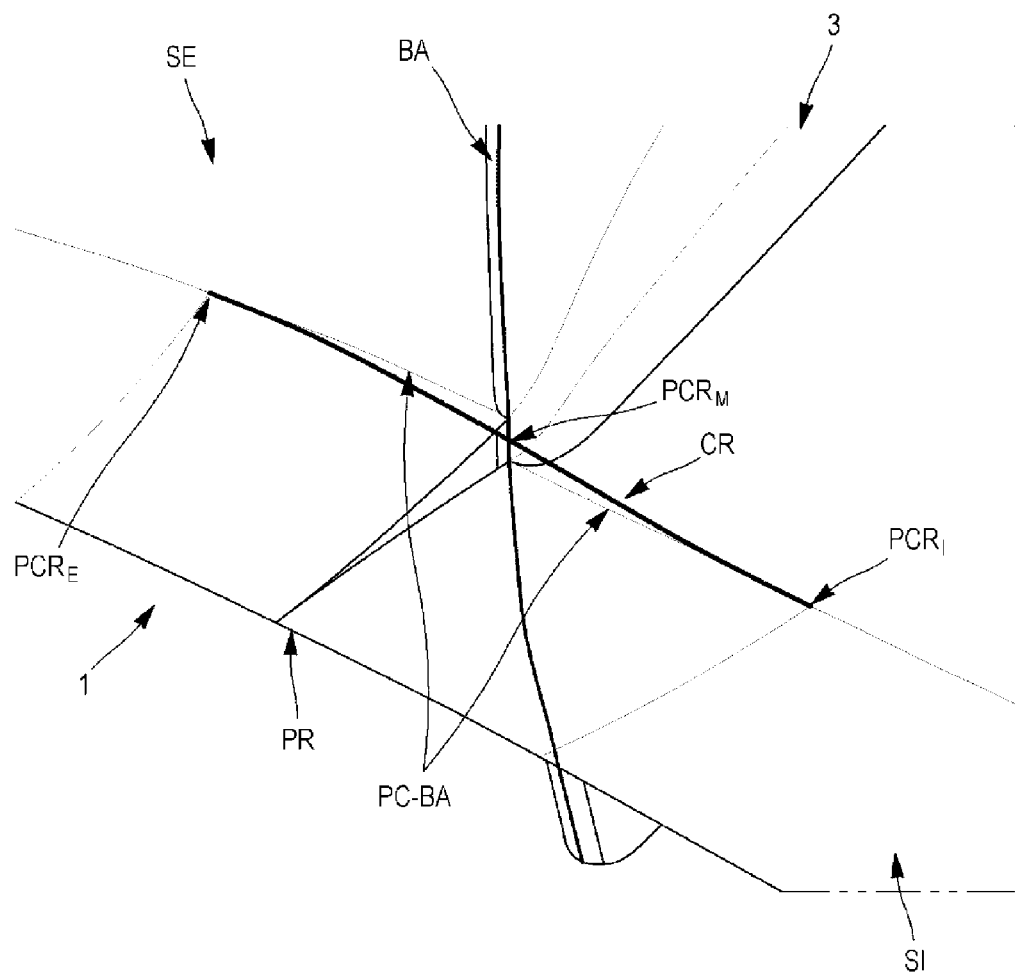

The connecting curve CR is also tangential to the first and the second surface SE, SI respectively at the first and the second extremal point $PCR_I$, $PCR_E$. The result is the curve CR as shown in FIG. 4b.

As is particularly preferred, the connecting curve CR passes through a midpoint $PCR_M$ arranged on the leading edge BA (respectively the trailing edge BF) of the blade 3, such that the distance between the midpoint $PCR_M$ and the first elementary surface SE is equal to the distance between the midpoint $PCR_M$ and the second elementary surface SI.

Figure 5:
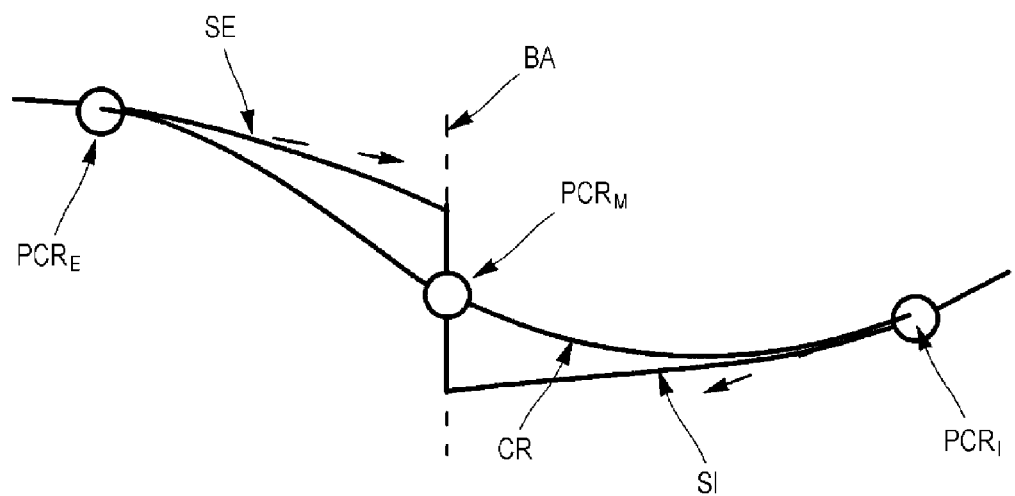
FIG. 5 illustrates a connecting curve used by the process according to the invention.

FIG. 5 easily shows this: the midpoint $PCR_M$ in other words is at the middle of the stair existing between the first and second elementary surfaces SE, SI. The respect of the tangents is likewise noticed.

Many connecting curves CR satisfying these conditions are possible, but as is preferred the latter is one or more splines (or even Bezier curves) entirely defined by the extremal points $PCR_I$, $PCR_E$ and the midpoint $PCR_M$, similar to what is used for modeling the construction planes PC-I, PC-E (see above).

Connecting Surface

The connecting curve CR is used by the data-processing means 11 to define a more extended surface, called connecting surface SR, which covers the discontinuity. So, in a step (c), the process comprises local modification of the first and second elementary surfaces Sk, SI, SE so as to respect said connecting curve in the vicinity of said discontinuity.

In the case of the first and second leading and trailing discontinuities this step consists of construction of the connecting surface SR having at any point of its edge continuity of tangency with the first or the second elementary surface Sk, SI, SE. The connecting surface SR locally replaces the elementary surfaces.

Figure 4C:
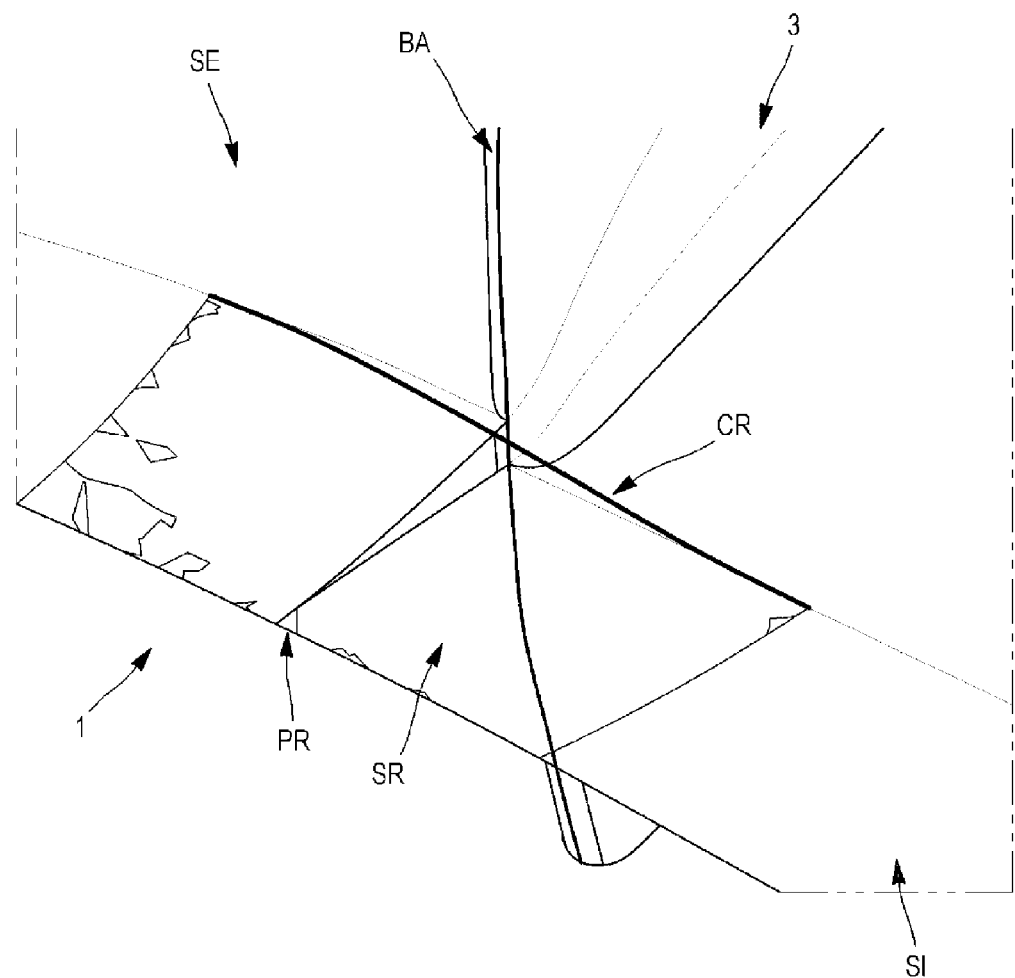

As shown in FIG. 4c, this first comprises construction of a first half of the connecting surface SR, which extends from an extremal edge PR, PS of the portion 2 to the construction curve CR. The equation of each of the edges of this half-surface is known (in the case of a substantially rectangular form as seen in FIG. 4c, the four sides are respectively defined by the equation of SI, the equation of PR, the equation of SE, and the equation of CR). As for the interior of this surface, any "sound" geometry (continuous, derivable, and simple in form) can be used.

Now at this point, there is still discontinuity between the connecting surface SR and the elementary surfaces SE, SI at the level of the connecting curve.

Figure 4D:
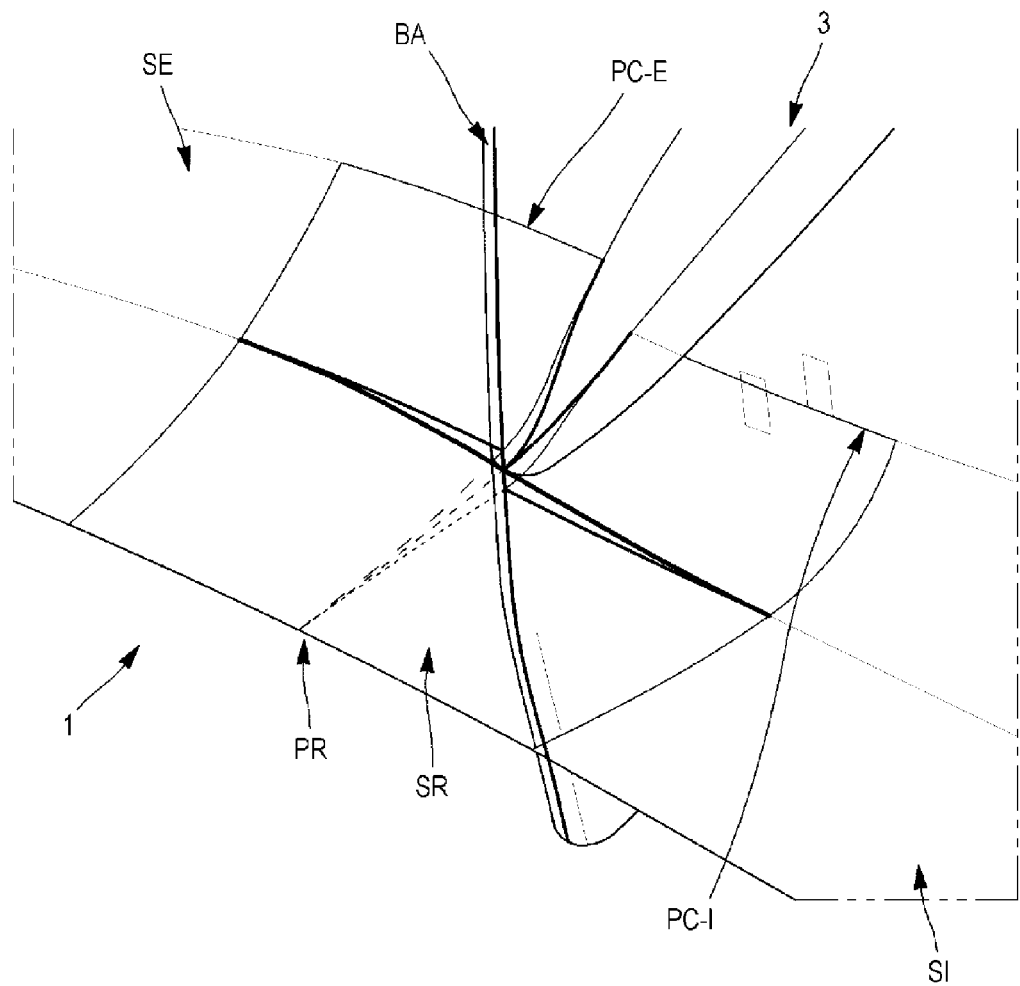

The connecting surface SR should be extended along the blade 3, in particular to attain a construction curve PC-I, PC-E of each of the elementary surfaces SE, SI (each elementary surface SI, SE has to have only at least one construction curve PC-k, PC-I, PC-E arranged between the leading edge BA and the trailing edge BF of the blade 3 (in other words other than the level of the discontinuities), such that the connecting surface SR extends as far as the first construction curve PC-I, PC-E beyond the connecting curve CR), as evident in FIG. 4d. The connecting surface SR continues to respect continuity of tangency at any point of its edge.

The connecting surface SR takes the form of a U about the leading BA (or trailing BF) edge of the blade 3. The assembly formed by the elementary surfaces SE, SI and the connecting surfaces SR is entirely $C^1$ and respects the skeleton of the blade 3. It defines the part of the modeled non-axisymmetric surface S.

In a final step (d), the model obtained for the surface S is outputted by the interface means 13 of the equipment 10 for exploitation, for example by display of surfaces in three dimensions or their equations.

Manufacturing Process and Piece

Once its surface S is modeled, the piece 1 (which as explained earlier can be especially a hub or a reactor casing) can be made. A manufacturing process of a piece is proposed whereof a portion has a non-axisymmetric surface, the process comprising steps of:

Performing the process according to the first aspect so as to model at least one part of said non-axisymmetric surface of the portion of the piece;

Manufacture of said piece in accordance with modeling of the at least one part of the resulting surface.

The resulting piece (whereof a portion has a non-axisymmetric surface modeled as explained previously), has a sounder geometry and better quality than known pieces. It can have increased solidity, better aerodynamic properties, reduced noise levels, etc.

Equipment

The equipment 10 (shown in FIG. 2) for performing the modeling process of at least one part of a non-axisymmetric surface S of a portion 2 of a piece 1 comprises data-processing means 11 configured to implement:

A modeling module of the at least two non-axisymmetric elementary surfaces Sk, SI, SE making up said surface S, each of the elementary surfaces Sk, SI, SE extending between the two extremal planes PS, PR of the portion 2 and being defined by at least one construction curve PC-k, PC-I, PC-E extending according to a plane substantially parallel to the extremal planes PS, PR, a first and a second elementary surface Sk, SI, SE being juxtaposed so as to present a junction at least $C^1$ at the level of the extremal planes PS, PR and at least one discontinuity;

A construction module of at least one connecting curve CR of class $C^1$ defined by a first and a second extremal point $PCR_I$, $PCR_E$ respectively arranged on the first and the second elementary surface Sk, SI, SE, said connecting curve CR being tangential to the first and the second surface respectively at the first and the second extremal point $PCR_I$, $PCR_E$;

A local modification module of the first and second elementary surfaces Sk, SI, SE so as to respect said connecting curve CR in the vicinity of said discontinuity;

An output module on an interface 13 of said equipment 10 of the at least one part of the surface S obtained.

Computer Program Product

According to other aspects, the invention relates to a computer program product comprising code instructions for the execution (on data processing means 11, in particular those of the equipment 10) of a process according to the first aspect of the invention of modeling of at least one part of a non-axisymmetric surface S of a portion 2 of a piece 1, and storage means readable by computer equipment (for example a memory 12 of this equipment 10) containing this computer program product.

The invention claimed is:

1. A method for manufacturing a piece a portion having a non-axisymmetric surface, the portion being limited by a first and a second extremal plane, a plurality of blades being arranged on a circumference of the portion of the piece, the process being characterized in that it comprises performing:

modeling at least one part of said non-axisymmetric surface of the portion of the piece, by data-processing means of equipment, comprising steps of:

(a) Modeling of at least two non-axisymmetric elementary surfaces making up said surface, each of the elementary surfaces extending between the two extremal planes of the portion and between two blades, and being defined by at least one construction curve extending according to a plane parallel to the extremal planes, a first and a second elementary surface being juxtaposed so as to be arranged on either side of a blade, respectively on an intrados and an extrados, and presenting a junction at least of class $C^1$ at the extremal planes and at least one discontinuity;

(b) Constructing of at least one connecting curve of class $C^1$ defined by a first and a second extremal point respectively arranged on the first and the second elementary surface, said connecting curve being tangential to the first and the second surface respectively at the first and the second extremal point;

(c) Locally modifying of the first and second elementary surfaces so as to respect said connecting curve in the vicinity of said at least one discontinuity; and (d) Outputting on an interface of said equipment of the at least one part of a resulting surface;

Manufacturing of said piece in accordance with the modeling of the at least one part of the resulting surface.

2. The process according to claim 1, wherein the junction between the first and second elementary surfaces has a first discontinuity extending from the first extremal plane to a leading edge of the blade and a second discontinuity extending from a trailing edge of the blade to the second extremal plane.

3. The process according to claim 2, wherein a connecting curve is constructed at said constructing step (b) for each of the first and second discontinuities, each connecting curve being tangential to the blade at the trailing edge or the leading edge.

4. The process according to claim 3, wherein a connecting curve passes through a midpoint arranged on the trailing edge or the leading edge of the blade such that a distance between the midpoint and the first elementary surface is equal to the distance between the midpoint and the second elementary surface.

5. The process according to claim 4, wherein a connecting curve is a spline entirely defined by the extremal points and the midpoint.

6. The process according to claim 2, wherein the step comprises for each of the first and second discontinuity, constructing of a connecting surface having at any point of its edge a continuity of tangency with the first or the second elementary surface.

7. The process according to claim 6, wherein each elementary surface has at least one construction curve arranged between the leading edge and the trailing edge of the blade, each of the two connecting surfaces extending over each of the first and second elementary surfaces of an extremal edge as far as the first construction curve beyond the connecting curve.

8. The process according to claim 1, wherein the step comprises for each construction curve of each elementary surface the sub-steps of:

Parameterizing of the construction curve as curve of class $C^1$ representing a value of a physical quantity characteristic of said surface as a function of a position along a width of the elementary surface, the curve being defined by:

Two extremal control points, respectively on each of the two blades between which said elementary surface extends, defining the extent of said width of the elementary surface;

At least one spline;

the parameterizing being carried out according to one or more parameters defining at least one of the extremal control points; and Determining of optimised values of said parameters of said curve.

9. The process according to claim 8, wherein each construction curve of each elementary surface is likewise defined by at least one intermediate control point arranged between the extremal points, and at least two splines connected at said intermediate control point;

the parameterizing being likewise carried out according to one or more parameters defining said intermediate control point.

10. The process according to claim 8, wherein the parameter defining an intermediate or extremal control point defining a construction curve are selected from an abscissa of the point, an ordinate of the point, an orientation tangential to the curve at the point and at least one tension coefficient linked to a half-tangent to the curve at the point.

11. The process according to claim 10, wherein a tension coefficient linked to a half-tangent to the curve at an intermediate or extremal point is a function of a second derivative value of the curve in the vicinity of the point.

12. The process according to claim 8, wherein each spline of a construction curve is a Bezier curve entirely determined by the control points defining its ends.

* * * * *